United States Patent [19] [11] 4,352,120
Kurihara et al. [45] Sep. 28, 1982

[54] SEMICONDUCTOR DEVICE USING SIC AS SUPPORTER OF A SEMICONDUCTOR ELEMENT

[75] Inventors: Yasutoshi Kurihara, Katsuta; Hiroaki Hachino; Kousuke Nakamura, both of Hitachi, all of Japan

[73] Assignee: Hitachi, Ltd., Tokyo, Japan

[21] Appl. No.: 142,778

[22] Filed: Apr. 22, 1980

[30] Foreign Application Priority Data

Apr. 25, 1979 [JP] Japan .................................. 54-50348

[51] Int. Cl.³ ..................... H01L 23/02; H01L 23/48; H01L 29/44
[52] U.S. Cl. ........................................ 357/81; 357/68; 357/65; 357/80; 357/75
[58] Field of Search ................... 357/4, 16, 49, 68, 80, 357/81, 65, 75

[56] References Cited

U.S. PATENT DOCUMENTS

| | | | |
|---|---|---|---|
| 3,389,022 | 6/1968 | Kravitz | 357/16 |
| 3,423,651 | 1/1969 | Legat et al. | 357/49 |
| 3,549,432 | 12/1970 | Sivertsen | 357/49 |
| 3,588,632 | 6/1971 | Nakata | 357/68 |
| 3,602,777 | 8/1971 | Berman | 357/68 |
| 3,714,520 | 1/1973 | Engeler et al. | 357/16 |
| 3,745,072 | 7/1973 | Scott | 357/4 |

Primary Examiner—Andrew J. James
Attorney, Agent, or Firm—Antonelli, Terry & Wands

[57] ABSTRACT

In a semiconductor device, an active element is mounted on a supporter made of silicon carbide SiC. Since the thermal expansion coefficient of SiC is nearly equal to that of the semiconductor element, the integration of the element and the supporter will not give rise to thermal stresses in the element. Since silicon carbide has high degrees of thermal dissipation and conduction, the supporter of SiC can effectively dissipate heat generated in the semiconductor element. And since SiC has a high electrical conductivity and a high mechanical strength and is also light, it can be used as electrodes for the semiconductor element.

9 Claims, 10 Drawing Figures

SEMICONDUCTOR DEVICE USING SIC AS SUPPORTER OF A SEMICONDUCTOR ELEMENT

BACKGROUND OF THE INVENTION

1. Field of the Invention

This invention relates to a semiconductor device in which a semiconductor element is mounted on a supporter of silicon carbide SiC.

2. Description of the Prior Art

In a semiconductor device, the semiconductor element generates heat, and, in order to prevent the instability of characteristics and the accelerated deterioration of effective life of the semiconductor device due to the generation of the heat, it is necessary to provide means for preventing the temperature of the element from rising above an allowable limit. The semiconductor element is very often soldered to electrodes or the supporter and therefore a serious problem is the thermal fatigue of the soldered portions due to the repeated temperature changes caused by the generation of heat. The thermal fatigue is caused by the accumulated mechanical stress resulting from the repeated changes in the soldered portions in temperature since the thermal expansion coefficient of the semiconductor element is different from that of the supporter. If worst comes to worst, the developed thermal fatigue of the soldered portions may cause breaks in electric connection or breakage of the element. Therefore, there must also be provided means for avoiding such faults. Further, the supporter may in some cases serve also as an electrode and it is necessary for the supporter not to have too high an electrical resistance in view of the economy of electric power to be consumed.

In most of the conventional semiconductor devices, the supporter is made of copper and the semiconductor element is mounted on the supporter. This structure, since the supporter is made of metal having excellent electrical and thermal conductivity, has an advantage that the generated heat is easily dissipated. Also excessive electric power consumption can be avoided. However, the thermal expansion coefficient ($18 \times 10^{-6}$/°C.) of the copper supporter is much greater than the thermal expansion coefficient ($\sim 3 \times 10^{-6}$/°C.) of the semiconductor element of silicon so that thermal fatigue tends to accumulate in the soldered portion. This tendency increases with the increase in the capacity of semiconductor element. To solve this problem, either an auxiliary supporter of molybdenum (having THC of $5.2 \times 10^{-6}$/°C.) or tungsten (having THC of $4.3 \times 10^{-6}$/°C.) is inserted as a stress relaxer between the copper supporter and the silicon element, or the thermal expansion coefficient of the supporter is made nearly equal to that of the element by some suitable means. However, molybdenum and tungsten in the form of metal is expensive and heavy (specific weight is 10.27 for Mo and 19.3 for W) and therefore the provision of such an auxiliary supporter goes counter to the requirement for the reduction of cost and weight. Also, for the last means of controlling the thermal expansion coefficients of the contiguous members, various technical points such as the control of the composition and the treatment of materials to be alloyed remain to be improved.

SUMMARY OF THE INVENTION

One object of this invention is to provide a semiconductor device having a supporter capable of effectively dissipating the heat generated by the semiconductor element.

Another object of this invention is to provide a semiconductor device in which the soldered portions between the semiconductor element and the supporter are free from thermal fatigue.

Yet another object of this invention is to provide a semiconductor device having a light and rigid supporter.

The feature of the semiconductor device according to this invention is that the semiconductor element is mounted on a supporter of silicon carbide.

This invention has been made as a result of the inventors' recognition of the adaptability of silicon carbide for the supporter of the semiconductor element. The recognition was made after the repeated experiments performed carefully on the basis of the physical and chemical properties of SiC: it (with a relative density of 98-100%) has a high mechanical strength, that is, a bending strength of about $\sim 100$ kg/mm$^2$ (at room temperatures) and a Vickers hardness of 3700-4000 (at 300 g); a heat diffusivity of 0.229 cm$^2$/sec (at room temperatures); a thermal conductivity of 0.6 W/°C. cm (at room temperatures) which is nearly equal to that of an iron system alloy; a thermal expansion coefficient of $4 \times 10^{-6}$/°C. (at room temperatures $\sim 900°$ C.) which is nearly equal to that of silicon; and a specific weight of 3.17 which is smaller by a factor of $\frac{1}{8}-1/6$ than those of copper, molybdenum and tungsten, and it is very excellent in chemical stability against a change in temperature and attacks of chemical agents.

Moreover, since silicon carbide has a high mechanical strength and a high chemical stability as described above, it can be used effectively as material for a casing. Further, since it has a high thermal conductivity and a thermal expansion coefficient nearly equal to that of the semiconductor element and since it is light, then it is excellent in dissipating the generated heat, almost free from thermal fatigue in the soldered portions and therefore very suitable for material of a supporter.

Silicon carbide SiC for a supporter may be in the form of single crystal of sintered body of SiC. The sintered SiC may be formed by using the hot-press method, the reactive sintering method or the vapor-phase reaction method. The hot-press method is to form a sintered body by heating and pressing a mixture of fine SiC power and an additive of Al, Al$_2$O$_3$, Fe or Si in non-oxidizing atmosphere, e.g. in a vacuum; the vapor-phase reaction method is to form SiC on a suitable substrate by thermally decomposing a chemical compound, especially organic of halide, of carbon C and silicon Si carried into a reaction chamber by carrier gas; and the reactive sintering method is to form a sintered body by sintering a mixture of carbon powder and silicon power or silicon dioxide powder.

The vapor-phase reaction method can provide a uniform and tight sintered body of SiC, but the thickness of the formed film can hardly exceed 1 mm. The reactive sintering method can produce a sintered body having a relatively large size, but it is difficult with this method to obtain a close texture. The hot-press method can form a sintered body having a tight texture and a large size and also has an advantage that the shape of the resultant sintered body can be arbitrarily varied if the shape of the mold is controlled.

Among the above methods, the hot-press method is most preferable for producing a sintered body since a supporter of a semiconductor element must have a small thermal resistance, a desired mechanical strength and a geometrical shape suited to that of the element.

If a sintered body of SiC, which is itself conductive, is coated with silicon oxide $SiO_2$, which is non-conductive, the composite body can be considered as an insulating substance. If the thickness of the insulating $SiO_2$ film is small enough, the excellent characteristics, i.e. a high thermal conductivity, a high degree of heat dissipation and a thermal expansion coefficient nearly equal to that of the semiconductor element, of the sintered body of SiC remain unaltered.

The semiconductor element and the supporter may be joined together by the anodic bonding method or soldering material.

If the semiconductor element is bonded to the conductive SiC supporter with glass ceramic or organic binding film, which is non-conductive, then the element and the supporter can be united while remaining insulated from each other.

DETAILED DESCRIPTION OF THE PREFERRED EMBODIMENTS

Embodiment 1

Figure 1:
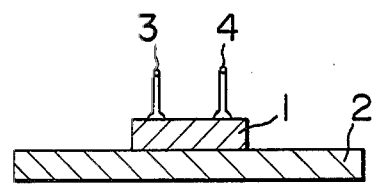
FIGS. 1 to 10 schematically show in cross section semiconductor devices as different embodiment of this invention.

As shown in FIG. 1, a silicon transistor pellet 1 as a semiconductor element is mounted on a supporter 2 of SiC, the emitter and the base region of the transistor pellet 1 are connected through aluminum lead wires 3 and 4 with terminals insulated from the supporter 2, the collector region of the transistor pellet 1 is connected through the supporter 2 with a collector terminal, and the assembly is molded with resin so as to completely isolate the transistor pellet 1 and the lead wires 3 and 4 from the atmosphere (molding structure is not shown). The transistor pellet 1 is treated by a surface passivation technique (not shown). The supporter of SiC used in this embodiment, which is conductive, is formed by pressing and sintering a mixture of aluminum powder and SiC powder in a vacuum. The hot-press was performed at 1900°-2100° C. under pressure of 100-700 kg/cm² for 5-60 minutes to produce a close texture. The silicon transistor pellet 1 and the SiC supporter 2 was united together by the anodic bonding method.

With the semiconductor device thus fabricated, the thermal resistance between the transistro pellet 1 and the SiC supporter 2 was less than 1° C./W and no abnormal change due to thermal fatigue was found in the joined region even after the transistor pellet 1 had experienced heat cycles from room temperatures to 125° C. one thousand times. Even a mechanical shock of 3000G given to the semiconductor device neither led to a break or a fault nor gave rise to any electrical abnormality. Moreover, the weight of the device thus completed is less by about 20% than that of the conventional semiconductor device having the same current capacity and also the number of the fabrication steps is reduced as compared with the conventional process.

As described above, the semiconductor device has a low thermal resistance since the transister pellet 1 is disposed on the SiC supporter 2 having a high thermal conductivity so that heat is very effectively dissipated; no fault due to thermal fatigue is caused in the joined region since the thermal expansion coefficient of the transistor pellet 1 is nearly equal to that of the supporter 2 so that stress is hardly generated in the joined region; a mechanical breakdown is hardly caused in the device since silicon carbide has a high mechanical strength; the weight of the device is reduced since the element and the supporter can be joined together without using an auxiliary supporter of heavy metal such as molybdenum or tungsten; and the number of the fabrication steps is reduced since the number of parts to be used can be reduced. The increase in power loss due to the formation of the supporter 2 with silicon carbide was at most about 1% as compared with the case where the supporter is made of metal. This increase in power consumption is however negligible from the practical point of view. Further, the semiconductor device in this embodiment is economically advantageous in that no special part for joining the element and the supporter together is needed and therefore that the number of the fabrication steps is relatively small, since the element is mounted directly on the supporter.

Embodiment 2

Figure 2:
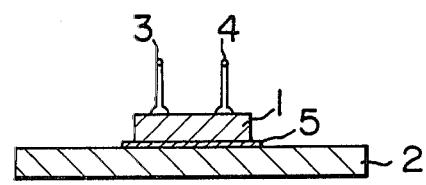

As shown in FIG. 2, in this embodiment, a silicon transistor pellet 1 is bonded to a supporter 2 of SiC obtained as in the above embodiment 1, by means of a solder layer 5. To effect soldering, metal films such as nickel films are formed on the surface of the silicon transistor pellet 1 and the supporter 2 by, for example, vacuum vapor deposition.

The semiconductor device having this structure was the same in the efficiency of heat dissipation and the resistivities to thermal fatigue and mechanical shock as the semiconductor device as the first embodiment of this invention. Moreover, according to this embodiment, the solder layer 5 need not serve to relax the stress in the bonded region between the transistor pellet 1 and the SiC supporter 2 since they have thermal expansion coefficients nearly equal to each other. Accordingly, the solder layer 5 is used only to fix the pellet 1 to the supporter 2 and therefore may has a small thickness so that an economical advantage is obtained owing to the reduction of the cost for materials. Further, workability also increases since in this embodiment soldering agent with a small quantity of Pb as additive, which has a low melting point, can be used instead of soldering agent rich in Pb, having a higher melting point.

Embodiment 3

Figure 3:
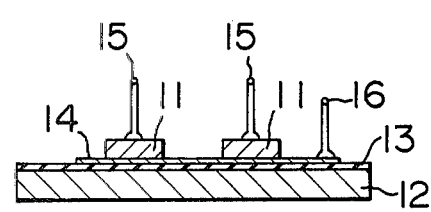

As shown in FIG. 3, in the semiconductor device in this embodiment, four silicon diode pellets 11 as semiconductor elements (only two of them are shown) are bonded to a supporter 12 of silicon carbide by soldering, with a silicon dioxide film 13 as insulator and an aluminum layer 14 formed by vacuum vapor-deposition inserted between the pellets 11 and the supporter 12. The diode pellets 11 are provided with lead wires 15 and the aluminum layer 14 with a lead wire 16. The interconnection is so made as to cause the four diodes to form a full-wave rectifier and the assembly is so molded with resin that at least the silicon diode pellets 11 may be hermetically sealed from the atmosphere. Thus, a hybrid IC device is completed.

This semiconductor device had the same degree of heat dissipation and the same resistivities to thermal fatique and mechanical shock as the above device as the first embodiment.

Moreover, no auxiliary supporter is inserted between each diode pellet 11 and the supporter 12 so that the general structure can be simplified and also that the numbers of used parts and the fabrication steps can be reduced. This contributes much to the reduction of the cost of the product.

As described above, silicon carbide supporter is useful also as a substrate for an IC which includes plural semiconductor elements.

Embodiment 4

Figure 4:
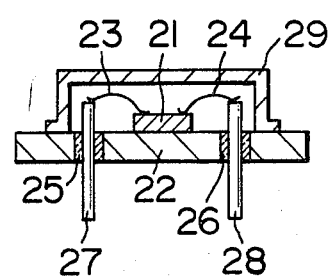

As shown in FIG. 4, according to this invention, a silicon transistor pellet 21 as a semiconductor element is bonded to a supporter 22 of silicon carbide, the emitter and the base region of the transistor pellet 21 are connected through aluminum lead wires 23 and 24 with metal terminals 27 and 28 insulated from the supporter 22 with glass packings 25 and 26 while the collector region of the transistor pellet 21 is electrically connected with the supporter 22, and the assembly is so encased in a cap 29 of SiC that at least the transistor pellet 21 may be completely isolated from the atmosphere. To facilitate the hermetical sealing of the supporter 22 and the cap 29, it is only necessary to form vacuum-deposited metal films on the sealing surfaces of both the members and to solder them together.

The thus completed semiconductor device had the same performances with respect to the ability to dissipate generated heat and the resistivity to thermal fatigue, as the above embodiment 1. A mechanical impact of 3000G applied to this device caused neither structure fault nor electrical deterioration. Even after a heating cycle ranging from $-30°$ C. to $+100°$ C. had been repeated one thousand times, a fault due to mechanical breakdown or degradation of sealing and a deterioration of electrical property could not be found. Further, even after the semiconductor device, except the exposed portions of the metal terminals 27 and 28, had been placed in the atmosphere of hydrogen chloride for 24 hours, its performance was found intact. This is because SiC is very stable against chemical corrosion.

As described above, it has also proved that a combination of a SiC supporter and a SiC cap can provide an excellent sealing characteristic. Such a cap may be of metal.

In the preceding embodiments, silicon carbide is used as the supporter for the silicon pellet, but similar effects can be obtained even if a metal supporter is used along with an auxiliary supporter of SiC, as described below.

Embodiment 5

Figure 5:
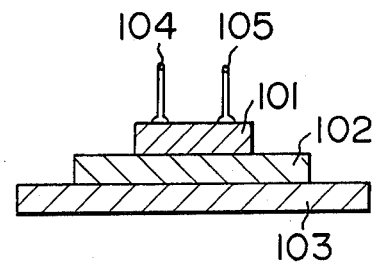

FIG. 5 shows a semiconductor device as a fifth embodiment of this invention, similar to the first embodiment above described. In this embodiment, a silicon transistor pellet 101 as a semiconductor element is placed on an auxiliary supporter 102 of silicon carbide, disposed on a supporter 103 of, for example, copper; the emitter and the base region of the transistor pellet 101 are connected through aluminum lead wires 104 and 105 with terminals insulated electrically from the auxiliary supporter 102 and the supporter 103; the collector region of the transistor pellet 101 is electrically connected through the auxiliary supporter 102 and the supporter 103 with a collector terminal; and the assembly is so molded with resin that the pellet 101, the auxiliary supporter 102 and the lead wires 104 and 105 may be isolated completely from the atmosphere (molded structure is not shown). The auxiliary supporter 102 and the supporter 103 was joined together by heat-pressure bonding. Another means of joining is to solder the part 102 to the part 103 by forming metal film on the soldering surface of the part 102. The silicon transistor pellet 101 and the auxiliary supporter 102 of silicon carbide was joined together by the anodic bonding method.

With the semiconductor device thus fabricated, the thermal resistance between the pellet 101 and the supporter 103 was less than 1° C./W and even after a heat cycle ranging from room temperatures to 125° C. had been repeated one thousand times, no abnormality due to thermal fatigue was found in the joined region between the transistor pellet 101 and the silicon carbide auxiliary supporter 102. Moreover, even when a mechanical impact of 3000G was applied to the device, it was neither broken nor experienced any abnormality in electrical property. Further, the weight of this device was less by about 5-10% than that of the conventional semiconductor device having the same current capacity.

Embodiment 6

Figure 6:
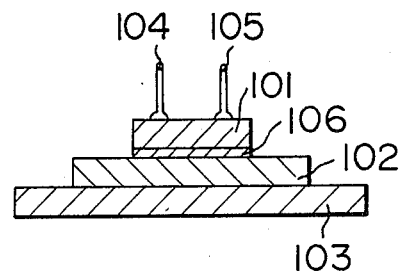

As shown in FIG. 6, in this embodiment, a transistor pellet 101 and an auxiliary supporter 102 are joined together by a solder layer 106 provided between them. The thus fabricated semiconductor device had the same performances with respect to the degree of heat dissipation and the resistivities to thermal fatigue and mechanical impact, as the semiconductor device as the fifth embodiment given above. In this embodiment, since the thermal expansion coefficient of the transistor pellet 101 is nearly equal to that of the auxiliary supporter 102, the solder layer 106 need not serve to relax the stress in the joined region.

Embodiment 7

Figure 7:
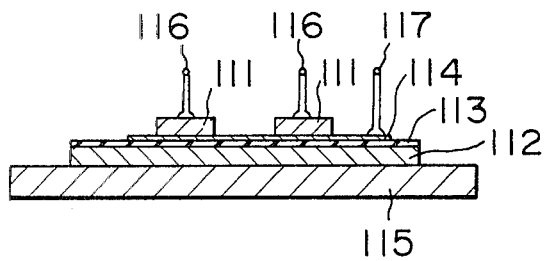

As shown in FIG. 7, in this embodiment, four silicon diode pellets 101 as semiconductor elements are bonded to an auxiliary supporter 112 of silicon carbide with a silicon dioxide film 113 and an aluminum layer 114 inserted therebetween; the auxiliary supporter 112 is then bonded to a supporter 115 of, for example, copper by heat-pressure bonding; lead wires 116 are attached to the respective diode pellets 111 while a lead wire 117 is attached to the aluminum layer 114; electrical interconnection is so made as to cause the four diodes 111 to constitute a full-wave rectifier; and this assembly is so molded with resin (molded structure is not shown) as to isolate at least the silicon diode pellets 111 from the atmosphere.

The thus fabricated semiconductor device had the same performances with respect to the degree of heat dissipation and the resistivities to thermal fatigue and mechanical impact, as the semiconductor device as the fifth embodiment. Moreover, according to this embodiment, since four diode pellets are mounted on a single auxiliary supporter, the effect of reducing the overall weight is remarkable, that is, this device was lighter by weight 30% than the conventional device having the same capacity.

As described above, silicon carbide supporter is useful also as a substrate for an IC which includes plural semiconductor elements.

Embodiment 8

Figure 8:
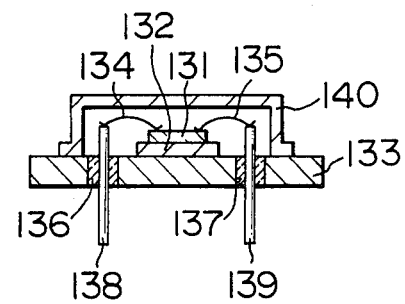

As shown in FIG. 8, in this embodiment, a silicon transistor pellet 131 as a semiconductor element is bonded to an auxiliary supporter 132 of silicon carbide and the auxiliary supporter 132 is in turn bonded to a supporter 133 of copper; the emitter and the base region of the transistor pellet 131 are connected through lead wires 134 and 135 of aluminum with metal terminals 138 and 139 insulated electrically from the supporter 133 with glass packings 136 and 137; the collector region of the transistor pellet 131 is connected through the auxiliary supporter 132 with the supporter 133; and this assembly is hermetically sealed with a cap 140 of silicon carbide so that at least the transistor pellet 131 may be isolated from the atmosphere.

The thus completed semiconductor device had the same performances with respect to the ability to dissipate generated heat and the resistivity to thermal fatigue, as the above embodiment 5. A mechanical impact of 3000G applied to this device caused neither structural fault nor electrical deterioration. Even after a heating cycle ranging from −30° C. to +100° C. had been repeated 1000 times, a fault due to mechanical breakdown and a deterioration of electrical properties could not be found. Moreover, even when the cap 140 of SiC was exposed to hydrogen chloride gas for 24 hours, no deterioration of characteristics was found. Further, according to this embodiment, since the auxiliary supporter and the cap are made of silicon carbide, the weight of this device can be less by about 35% than the conventional device having the same capacity.

Embodiment 9

Figure 9:
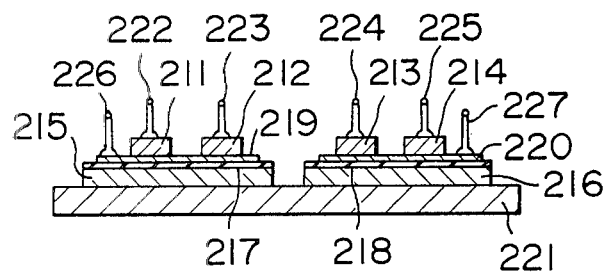

As shown in FIG. 9, in this embodiment, silicon diode pellets 211, 212, 213 and 214 as semiconductor elements are bonded to auxiliary supporters 215 and 216 with silicon dioxide films 217 and 218 and aluminum layers 219 and 220 inserted therebetween; the auxiliary supporters are in turn bonded to a supporter 221 of copper; lead wires 222 to 225 are attached to the respective diode pellets while lead wires 226 and 227 are attached to the aluminum layers; electrical interconnection is so made as to cause each of the diodes to form a part of rectifying circuit; and a hybrid IC device is completed by molding the assembly with resin (molded structure is not shown) in such a manner that at least the silicon diode pellets 211, 212, 213 and 214 are isolated from the atmosphere.

The thus fabricated semiconductor device had the same performances with respect to the ability to dissipate generated heat and the resistivities to thermal fatigue and mechanical impact, as the above embodiment 5. Moreover, for the same reason as in the embodiment 7, the weight of this device can be less by about 20% than that of the conventional device having the same capacity.

As described above, the supporter of SiC can be effectively used in the case where plural semiconductor elements are mounted on a single supporter.

Embodiment 10

Figure 10:
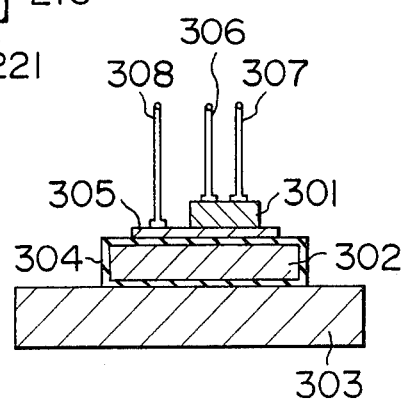

As shown in FIG. 10, in this embodiment, a silicon transistor pellet 301 as a semiconductor element is bonded to an auxiliary supporter 302 of SiC and the auxiliary supporter 302 is in turn bonded to a heat radiator 303 of Al. The silicon carbide auxiliary supporter 302, which is a sintered body obtained as in the embodiment 1, is coated with a silicon dioxide film 304 formed by heating the supporter 302 in an oxidizing atmosphere. The silicon dioxide film 304 may be formed by CVD (chemical vapor deposition) method or any other suitable method, instead of by the thermal oxidation method described above. A conductive layer 305 of, for example, copper is formed by, for example, vacuum evaporation on the surface of the auxiliary supporter 302 where the silicon transistor pellet 301 is bonded. Lead wires 306 and 307 are attached to the emitter and the base region of the silicon transistor pellet 301 by, for example, bonding and the collector region of the pellet 301 is bonded to the conductive layer 305 by means of soldering agent (not shown). A lead wire 308 is attached to the conductive layer 305 by, for example, bonding.

That surface of the auxiliary supporter 302 which is brought into contact with the heat radiator plate 303, is coated with a vapor-deposited layer of, for example, nickel (not shown), that is, the layer of nickel is formed on the silicon dioxide film 304. This layer of nickel is soldered to the metal radiator 303 to fasten the auxiliary supporter 302 to the radiator plate 303, the solder layer being not shown.

Since the silicon dioxide film 304 is non-conductive, the silicon transistor pellet 301 is insulated from the radiator plate 303. The silicon dioxide film may be replaced by another insulating material such as, for example, glass or ceramic.

The insulating film of silicon dioxide, glass or ceramic has only to have a thickness sufficient for maintaining insulation and since the desired thickness is very small, various preferable characteristics of silicon carbide are never injured by the provision of the insulating film. The auxiliary supporter can therefore fulfill its function of rigidly supporting the semiconductor element thereon and effectively dissipating generated heat.

In the preceding description, this invention has been described by way of embodiments, but it should here be noted that this invention is by no means limited to those embodiments. For example, the effects and/or the advantages of this invention can also be enjoyed in the following cases:

(1) Where the SiC supporter or auxiliary supporter is made of a single crystal of silicon carbide.
(2) Where the semiconductor element has a substrate of germanium, gallium, arsenide or gallium phosphide whose thermal expansion coefficient differs by only a small quantity from that of silicon carbide. In this case, a solder layer may be inserted between the supporter and the semiconductor element, if necessary.
(3) Where the substrate of the semiconductor element is of silicon carbide.
(4) Where the auxiliary supporter or the supporter of SiC, which need not be in the shape of flat plate, has protrusions, depressions or grooves in one or two main surfaces thereof.
(5) Where all the electrodes of the semiconductor element, which need not be provided on both main surfaces (not limited to the case where the heat generation by the element is remarkable), are provided on only one of the two main surfaces.
(6) Where electronic circuit elements other than a semiconductor element, such as resistors or capacitors are mounted on the supporter or the auxiliary supporter of silicon carbide.
(7) Where a layer of metal other than solder alloy of aluminum, such as one selected from among gold, silver, copper, gallium, tin, silicon, germanium, palladium, chromium, nickel, titanium, molybdenum and tungsten, is inserted between the supporter and the element.

(8) Where in the embodiments shown in FIGS. 5 to 9 the supporter is made of metal other than copper, such as, for example, aluminum having a high thermal conductivity, alloy of Fe-Ni-Co system having a small thermal expansion coefficient, or a combination of them.

(9) Where in the embodiments shown in FIGS. 5 to 9 the auxiliary supporter is bonded to the supporter by means of a layer of alloy.

As described above, according to this invention, the following effects and/or merits can be obtained.

(1) Since the supporter or the auxiliary supporter has a high thermal conductivity and therefore can effectively dissipate generated heat, then the overheat of the semiconductor element can be prevented so that the characteristics of the device can be kept stable.

(2) Since the difference between the thermal expansion coefficient of the semiconductor element and that of the supporter of SiC is small, the stress generated thermally in the joined region between the element and the supporter is small and thermal fatigue of the joined region due to temperature change can also be decreased. As a result, the bonding is very regid and stable against temperature change.

(3) Since the weight of the supporter or the auxiliary supporter can be reduced, the overall weight of the semiconductor device can be reduced.

(4) Since silicon carbide has a high mechanical strength, the semiconductor element mounted on the supporter of SiC can easily withstand an external mechanical impact.

(5) Since the thermal expansion coefficient of the semiconductor element is nearly equal to that of silicon carbide, the thickness of a metal layer provided between the element and the supporter of SiC to absorb stresses need not be large. And the metal layer may be replaced by a layer of metal having a lower melting point.

(6) Since the semiconductor element can be directly bonded to the supporter or the auxiliary supporter of SiC, the number of used parts or the number of the fabrication steps can be reduced. This leads to the reduction of cost.

(7) Since silicon carbide is chemically stable, the treatment thereof is easy. Also, in the case where the semiconductor element is sealed by a cap of SiC, the completed device can be used, for the same reason as above, in a chemically active atmosphere.

We claim:

1. A semiconductor device comprising at least one semiconductor element and a supporter of silicon carbide, wherein said element is mounted on said supporter and said supporter is a sintered body including therein one or more of Al, $Al_2O_3$, Fe and Si.

2. A semiconductor device as claimed in claim 1, wherein the substrate of said semiconductor element is one of Si, SiC, Ge, GaAs and GaP.

3. A semiconductor device as claimed in claim 1, wherein said semiconductor element is directly bonded to said supporter of SiC.

4. A semiconductor device as claimed in claim 1, wherein said semiconductor element is bonded to said supporter of SiC by soldering material.

5. A semiconductor device as claimed in claim 1, wherein said semiconductor element is bonded to said supporter of SiC, with an insulator layer inserted therebetween.

6. A semiconductor device as claimed in claim 1, wherein said semiconductor element is sealed in a hermetical casing constituted by said supporter and a sealing cap bonded to said supporter.

7. A semiconductor device as claimed in claim 1, wherein said supporter of silicon carbide is mounted on a metal supporter.

8. A semiconductor device as claimed in claim 6, wherein said sealing cap is of resin, metal or SiC.

9. A semiconductor device as claimed in claim 7, wherein plural supporters of SiC are mounted on said metal supporter and one or some of semiconductor elements, resistors or capacitors or any combination of semiconductor elements, resistors and capacitors are mounted on each of said plural supporters of SiC.

* * * * *